US012805335B2

(12) United States Patent
Komiyama et al.

(10) Patent No.: US 12,805,335 B2
(45) Date of Patent: Nov. 17, 2026

(54) ELECTRIC SHIELDING MODULE AND METHOD FOR MANUFACTURING THE SAME

(71) Applicant: Murata Manufacturing Co., Ltd., Nagaokakyo (JP)

(72) Inventors: Minoru Komiyama, Nagaokakyo (JP); Tadashi Nomura, Nagaokakyo (JP); Yoshihito Otsubo, Nagaokakyo (JP); Toru Komatsu, Nagaokakyo (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 976 days.

(21) Appl. No.: 18/056,307

(22) Filed: Nov. 17, 2022

(65) Prior Publication Data

US 2023/0163086 A1 May 25, 2023

Related U.S. Application Data

(63) Continuation of application No. PCT/JP2021/017894, filed on May 11, 2021.

(30) Foreign Application Priority Data

Jun. 5, 2020 (JP) ................................ 2020-098833

(51) Int. Cl.
*H10W 44/20* (2026.01)
*H05K 9/00* (2006.01)
(Continued)

(52) U.S. Cl.
CPC .......... *H10W 44/20* (2026.01); *H05K 9/0049* (2013.01); *H05K 9/0084* (2013.01); *H10W 74/10* (2026.01); *H10W 90/701* (2026.01)

(58) Field of Classification Search
CPC ... H01L 23/66; H01L 23/31; H01L 23/49811; H01L 23/3121; H10W 90/00; H10W 74/114; H10W 44/20; H10W 42/20
See application file for complete search history.

(56) References Cited

U.S. PATENT DOCUMENTS

2012/0228751 A1* 9/2012 Song .................... H10W 42/00 438/109
2016/0007510 A1* 1/2016 Cheng ................. H05K 9/0088 428/335
(Continued)

FOREIGN PATENT DOCUMENTS

JP 2017-143210 A 8/2017
JP 6376230 B2 8/2018
(Continued)

OTHER PUBLICATIONS

International Search Report for PCT/JP2021/017894 dated Jul. 20, 2021.

*Primary Examiner* — Nduka E Ojeh
(74) *Attorney, Agent, or Firm* — McDonald Hopkins LLC

(57) ABSTRACT

A module comprises: a substrate having a first surface; a first component and a second component mounted on the first surface; a conductive member mounted therebetween; and a resin seal disposed to cover the first surface, the first component and the second component and also seal a portion of the conductive member. The resin seal has a recess that exposes at least a portion of the conductive member, and inside the recess the resin seal and the conductive member have a side surface and a surface, respectively, covered with a first shield film. The first shield film inside the recess is covered with a second shield film smaller in thickness than the first shield film. The resin seal has a surface facing away from the first surface and covered with the second shield film.

17 Claims, 10 Drawing Sheets

(51) Int. Cl.
*H10W 74/10* (2026.01)
*H10W 90/00* (2026.01)

(56) References Cited

U.S. PATENT DOCUMENTS

| | | | | |
|---|---|---|---|---|
| 2018/0158782 | A1 | 6/2018 | Kawabata | |
| 2020/0137893 | A1 | 4/2020 | Nomura et al. | |
| 2021/0043585 | A1 | 2/2021 | Nomura et al. | |
| 2022/0238455 | A1* | 7/2022 | Ishido | H10W 42/20 |

FOREIGN PATENT DOCUMENTS

| | | | | |
|---|---|---|---|---|
| WO | WO-2019004332 | A1 * | 1/2019 | H05K 3/421 |
| WO | 2019/216300 | A1 | 11/2019 | |

* cited by examiner

ELECTRIC SHIELDING MODULE AND METHOD FOR MANUFACTURING THE SAME

CROSS REFERENCE TO RELATED APPLICATION

This is a continuation of International Application No. PCT/JP2021/017894 filed on May 11, 2021 which claims priority from Japanese Patent Application No. 2020-098833 filed on Jun. 5, 2020. The contents of these applications are incorporated herein by reference in their entireties.

BACKGROUND OF THE DISCLOSURE

Field of the Disclosure

The present disclosure relates to a module and a method for manufacturing the same.

Description of the Related Art

A high-frequency module comprising a wiring board, a resin seal layer, and a shield film is described in International Publication WO2019/004332A1 (PTL 1). In the high-frequency module described in PTL 1, a conductive member is mounted on a major surface of the wiring board, the resin seal layer has a recess formed therein to expose a portion of the conductive member, and the shield film shields a wall surface of the recess and the exposed portion of the conductive member.

(PTL 1) International Publication WO2019/004332A1

BRIEF SUMMARY OF THE DISCLOSURE

However, generally, when a shield film is formed in a recess, the shield film tends to be small in thickness inside a recess provided in a resin seal. In particular, when the shield film is formed in the recess by sputtering, the shield film tends to be smaller in thickness. When the shield film is small in thickness inside the recess, the film may provide insufficient shielding performance.

Accordingly, a possible benefit of the present disclosure is to provide a module capable of ensuring sufficient shielding performance even in a recess provided in a resin seal, and a method for manufacturing the module.

In order to achieve the above possible benefit, a module according to the present disclosure comprises: a substrate having a first surface; first and second components mounted on the first surface; a conductive member mounted on the first surface between the first and second components; and a resin seal disposed to cover the first surface and the first and second components and also seal a portion of the conductive member, the resin seal having a recess that exposes at least a portion of the conductive member, inside the recess the resin seal and the conductive member having a side surface and a surface, respectively, covered with a first shield film, the first shield film inside the recess being covered with a second shield film smaller in thickness than the first shield film, the resin seal having a surface facing away from the first surface and covered with the second shield film.

The present disclosure can provide a module capable of ensuring sufficient shielding performance even in a recess provided in a resin seal.

DETAILED DESCRIPTION OF THE DISCLOSURE

The figures indicate a dimensional ratio, which does not necessarily provide a representation which is faithful to reality, and may be exaggerated for the sake of illustration. In the following description, when referring to a concept of being upper or lower, it does not necessarily mean being absolutely upper or lower and may instead mean being relatively upper or lower in a position shown in a figure.

First Embodiment

Figure 1:
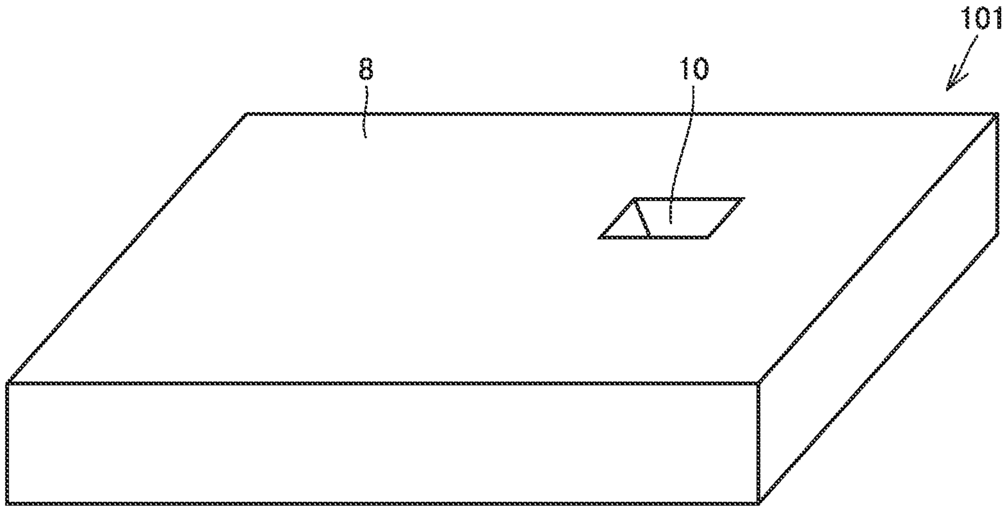
FIG. 1 is a perspective view of a module according to a first embodiment of the present disclosure.
Figure 2:
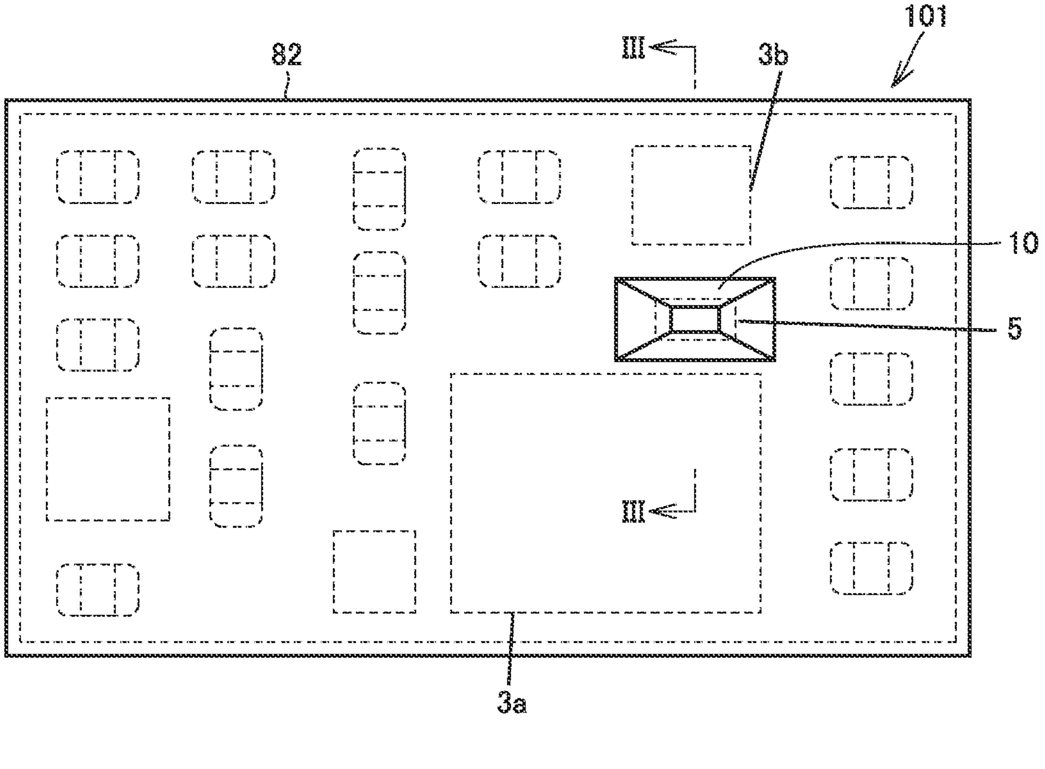
FIG. 2 is a plan view of the module according to the first embodiment of the present disclosure.
Figure 3:
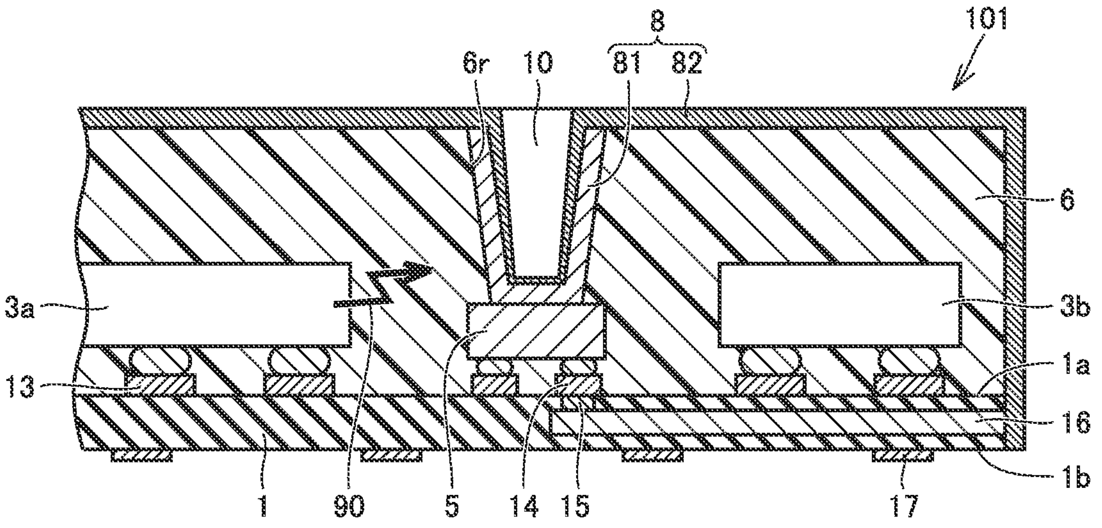
FIG. 3 is a cross section taken along a line III-III indicated in FIG. 2.

A module according to a first embodiment of the present disclosure will now be described with reference to FIGS. 1 to 3. FIG. 1 shows an external appearance of a module 101 according to the present embodiment. Module 101 has an upper surface and a side surface covered with a shield film 8. FIG. 2 is a plan view of module 101. In FIG. 2, components 3*a*, 3*b* etc. incorporated in module 101 are also indicated by broken lines. In FIG. 2, a recess 10 located at the upper surface of module 101 is visible. A conductive member 5 is located deep behind recess 10. FIG. 3 is a cross section taken along a line III-III indicated in FIG. 2. Shield film 8 includes a first shield film 81 and a second shield film 82.

Module 101 according to the present embodiment includes a substrate 1 having a first surface 1*a*, first and second components 3*a* and 3*b* mounted on first surface 1*a*, conductive member 5, and a resin seal 6. Conductive member 5 is mounted on first surface 1*a* between first component 3*a* and second component 3*b*. Resin seal 6 is disposed to cover first surface 1*a* and first and second components 3*a* and 3*b* and also seal a portion of conductive member 5. Resin seal 6 has a recess 6*r* that exposes at least a portion of conductive member 5. Inside recess 6*r* provided in resin seal 6, resin seal 6 and conductive member 5 have a side surface and a surface, respectively, covered with first shield film 81. First shield film 81 inside recess 6*r* provided in resin seal 6 is covered with second shield film 82 smaller in thickness than first shield film 81. Second shield film 82 covers a surface of resin seal 6 facing away from first surface 1*a*. In the present embodiment, first shield film 81 is not a sputtered film.

Substrate 1 has first surface 1*a* and a second surface 1*b*. First surface 1*a* and second surface 1*b* face away from each other. A pad electrode 13 and a ground electrode 14 are disposed on substrate 1 at first surface 1*a*. First component 3*a* is mounted via pad electrode 13. A ground conductor pattern 16 is disposed inside substrate 1. Ground electrode 14 and ground conductor pattern 16 are electrically connected by a conductor via 15. Conductive member 5 is mounted so as to be electrically connected to ground electrode 14. A connection terminal 17 is disposed on substrate 1 at second surface 1*b*. Connection terminal 17 is used to ensure electrical connection when module 101 is mounted on a mother board or the like.

In the present embodiment, shield film 8 has a two-layer structure of first shield film 81 and second shield film 82 inside recess 6*r* provided in resin seal 6, and a module also capable of ensuring sufficient shielding performance in recess 6*r* in which the film would otherwise tend to be small in thickness can be provided. This is particularly effective when the film is formed in the recess by sputtering, as will be described hereinafter. For example, an electromagnetic wave 90 emitted from first component 3*a* is interrupted by shield film 8 located in recess 10. This can reduce a degree of an effect that electromagnetic wave 90 emitted from first component 3*a* has on second component 3*b*.

First shield film 81 is preferably a metal grain film. Adopting this configuration allows easy production through a process described hereinafter.

First shield film 81 preferably contains silver as a major ingredient. Adopting this configuration allows easy production through a process described hereinafter.

Conductive member 5 is preferably a Cu block. Adopting this configuration allows conductive member 5 to be easily implemented.

(Manufacturing Method)

A method for manufacturing a module according to the present embodiment will now be described with reference to FIGS. 4 to 13.

Figure 4:
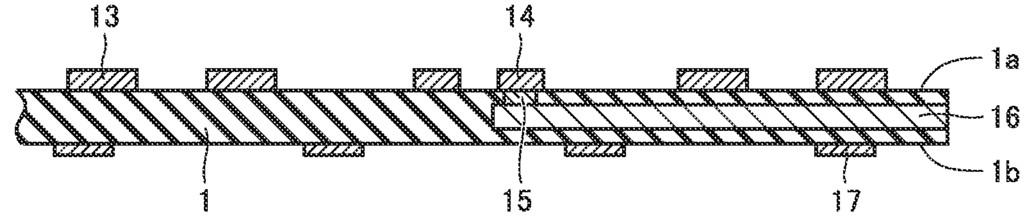
FIG. 4 is a diagram for illustrating a first step of a method for manufacturing the module according to the first embodiment of the present disclosure.
Figure 5:
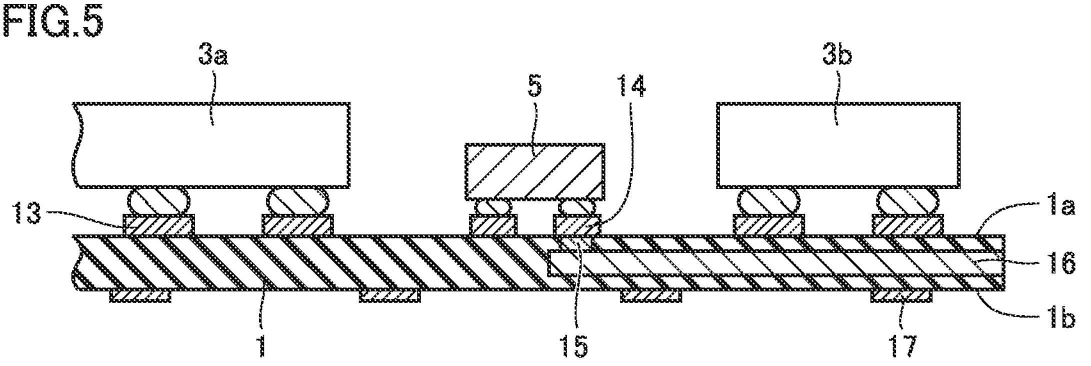
FIG. 5 is a diagram for illustrating a second step of the method for manufacturing the module according to the first embodiment of the present disclosure.

Initially, as shown in FIG. 4, substrate 1 is prepared. Substrate 1 has first surface 1*a* and second surface 1*b*. Substrate 1 has ground conductor pattern 16 incorporated therein. Subsequently, as shown in FIG. 5, first component 3*a*, second component 3*b*, conductive member 5, etc. are mounted on substrate 1 at first surface 1*a*.

Figure 6:
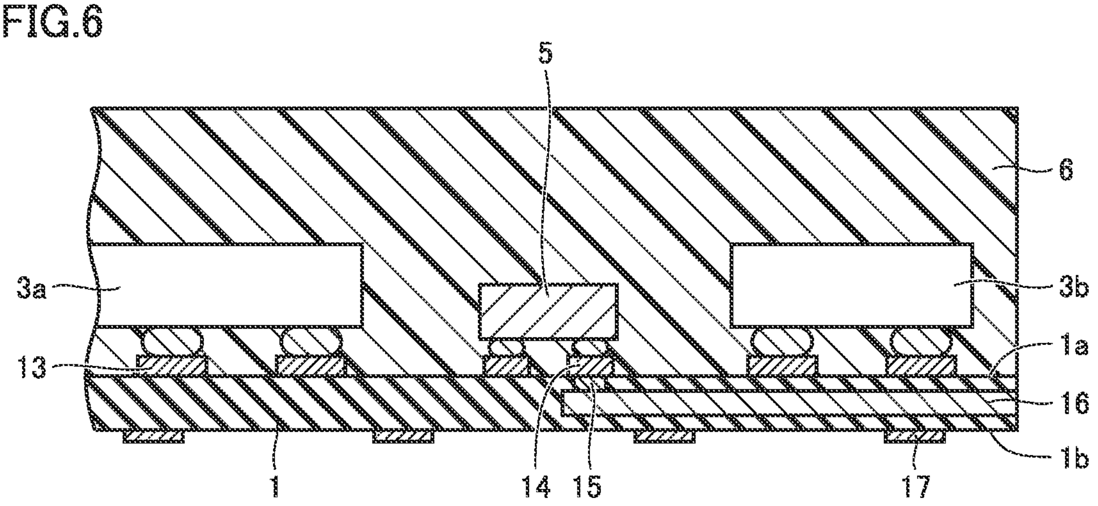
FIG. 6 is a diagram for illustrating a third step of the method for manufacturing the module according to the first embodiment of the present disclosure.
Figure 7:
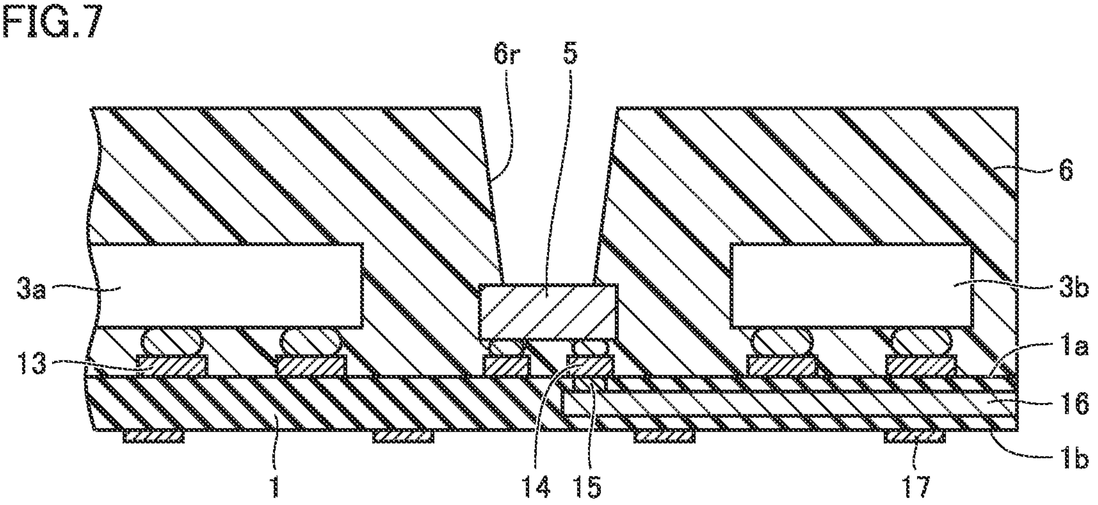
FIG. 7 is a diagram for illustrating a fourth step of the method for manufacturing the module according to the first embodiment of the present disclosure.

As shown in FIG. 6, resin seal 6 is disposed. Resin seal 6 seals first component 3*a*, second component 3*b*, conductive member 5, etc. as well as first surface 1*a*. As shown in FIG. 7, recess 6*r* is formed in resin seal 6. Recess 6*r* can be formed by laser processing. Conductive member 5 is exposed at a bottom surface of recess 6*r*. The presence of conductive member 5 prevents laser light from reaching substrate 1.

Figure 8:
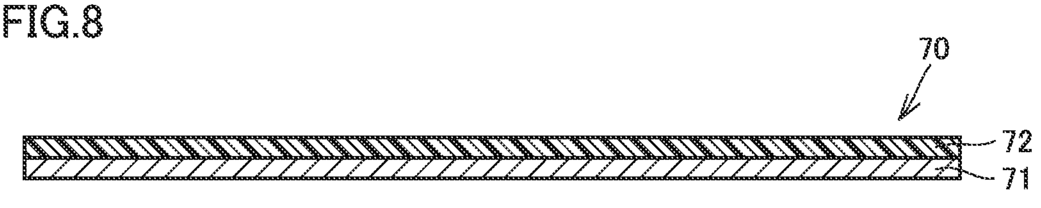
FIG. 8 is a cross section of a composite sheet used in the method for manufacturing the module according to the first embodiment of the present disclosure.
Figure 9:
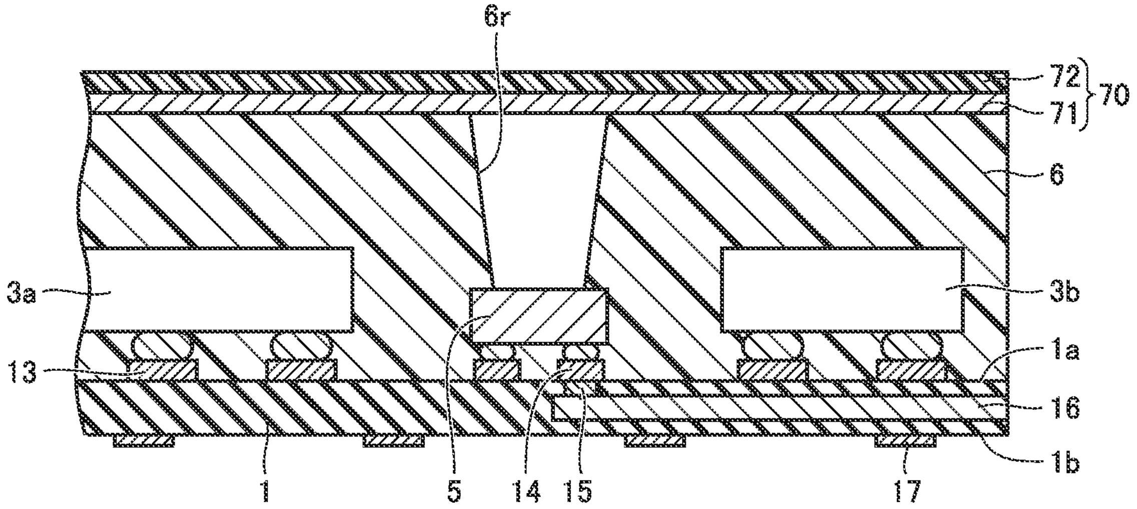
FIG. 9 is a diagram for illustrating a fifth step of the method for manufacturing the module according to the first embodiment of the present disclosure.
Figure 10:
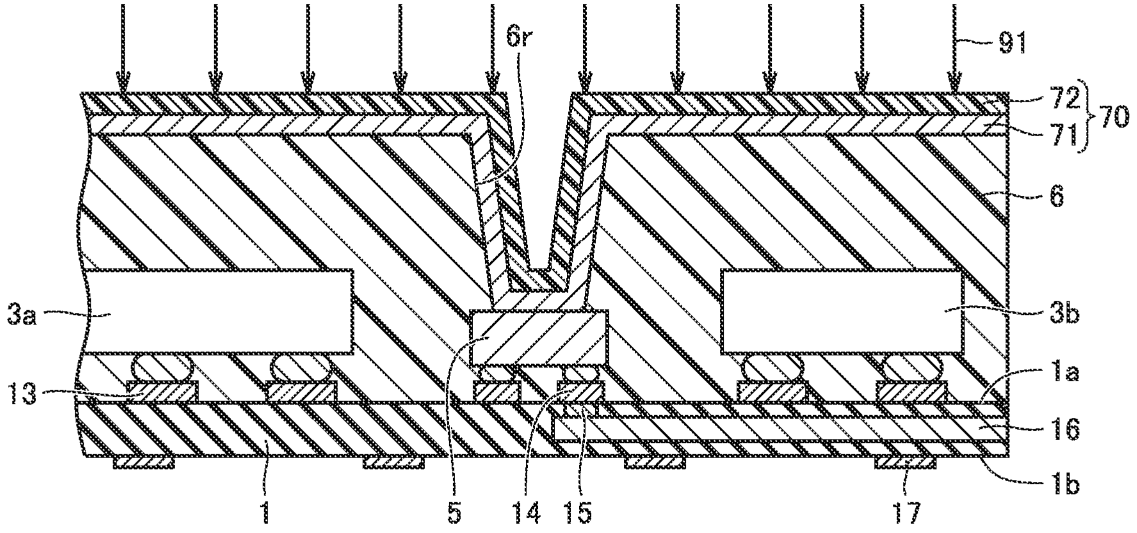
FIG. 10 is a diagram for illustrating a sixth step of the method for manufacturing the module according to the first embodiment of the present disclosure.

A film 70 shown in FIG. 8 is prepared. Film 70 includes a conductive film 71 and a release film 72. Film 70 is a composite sheet. Conductive film 71 includes metal grains. Conductive film 71 is a metal grain film. Release film 72 is a resin film. Film 70 may be a commercially available film. As shown in FIG. 9, film 70 is placed on resin seal 6. Heating and compression are applied as indicated in FIG. 10 by arrows 91. As a result, as shown in FIG. 10, film 70 deforms along a shape of a surface of resin seal 6 and adheres to an inner surface of recess 6*r* provided in resin seal 6.

Figure 11:
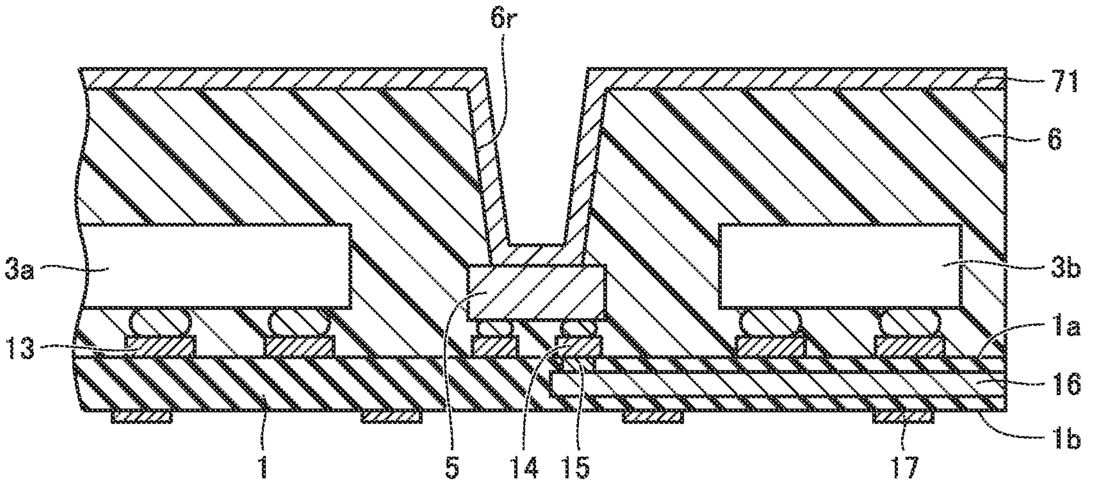
FIG. 11 is a diagram for illustrating a seventh step of the method for manufacturing the module according to the first embodiment of the present disclosure.
Figure 12:
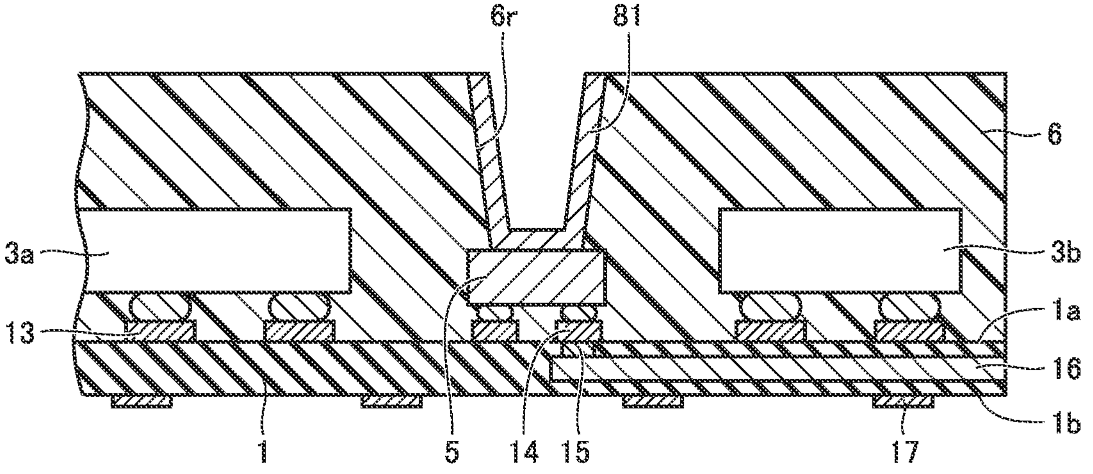
FIG. 12 is a diagram for illustrating an eighth step of the method for manufacturing the module according to the first embodiment of the present disclosure.
Figure 13:
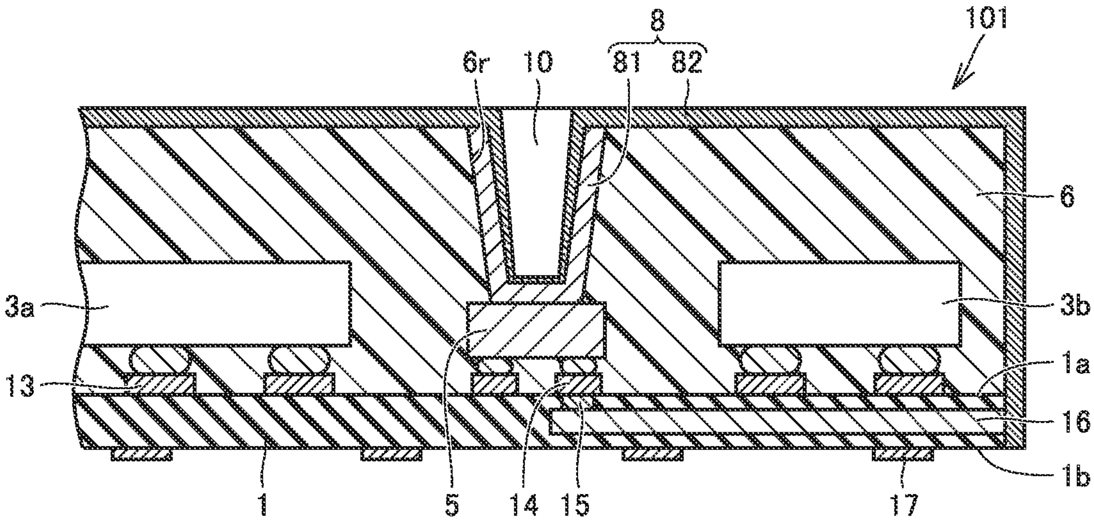
FIG. 13 is a diagram for illustrating a ninth step of the method for manufacturing the module according to the first embodiment of the present disclosure.

Subsequently, by peeling release film 72, a structure is obtained as shown in FIG. 11. By polishing an upper surface, the structure will be as shown in FIG. 12. At this stage, resin seal 6 has an upper surface exposed. Recess 6*r* provided in resin seal 6 has an inner surface covered with first shield film 81. Sputtering is performed to form second shield film 82 as shown in FIG. 13. Note that, on the inner surface of recess 6*r* provided in resin seal 6, a dual structure of first shield film 81 and second shield film 82 is provided. Resin seal 6 has the upper surface and a side surface covered with second shield film 82. There is no first shield film 81 on the upper and side surfaces of resin seal 6. Module 101 shown in FIGS. 1 to 3 can thus be obtained.

Although a structure for a single product has been shown and described herein, a collective substrate corresponding to a plurality of products may be used and each process may collectively be performed. In that case, for example, second shield film 82 may be sputtered after the collective substrate is divided by a size of each individual product.

Second Embodiment

Figure 14:
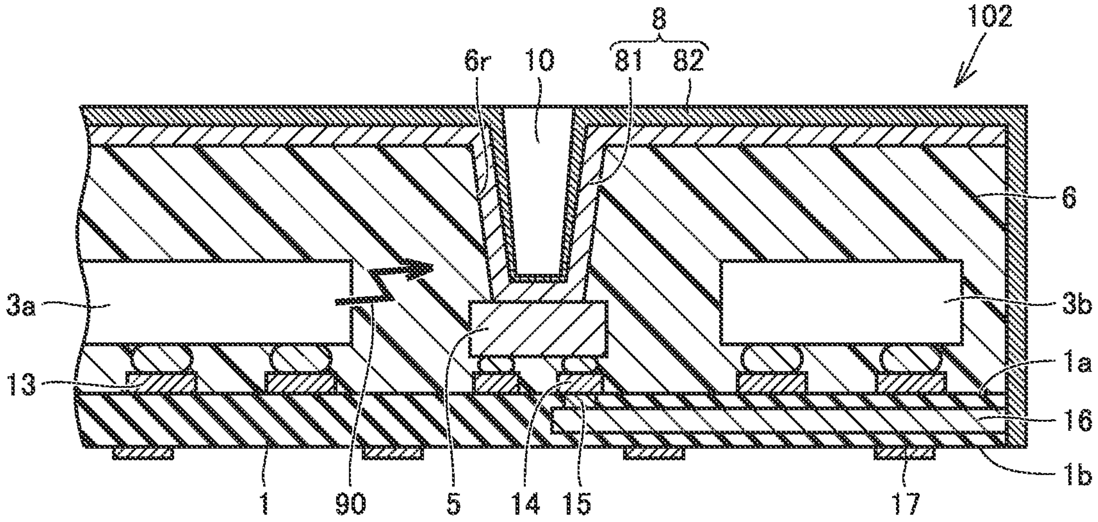
FIG. 14 is a partial cross section of a module according to a second embodiment of the present disclosure.

Referring to FIG. 14, a module according to a second embodiment of the present disclosure will now be described. FIG. 14 is a partial cross section of a module 102 according to the present embodiment.

Module 102 has a basic configuration similar to that of module 101 described in the first embodiment except for a configuration of a film covering an upper surface of resin seal 6. In module 102, first shield film 81 extends to and on the upper surface of resin seal 6. On the upper surface of resin seal 6, shield film 8 has a dual structure of first shield film 81 and second shield film 82. In other words, in the present embodiment, first shield film 81 is interposed between resin seal 6 and second shield film 82 on a surface of resin seal 6 facing away from first surface 1*a*.

In the present embodiment, shield film 8 has a dual structure on the upper surface of resin seal 6, which allows enhanced shielding performance in a direction perpendicular to first surface 1*a* of substrate 1.

Third Embodiment

Figure 15:
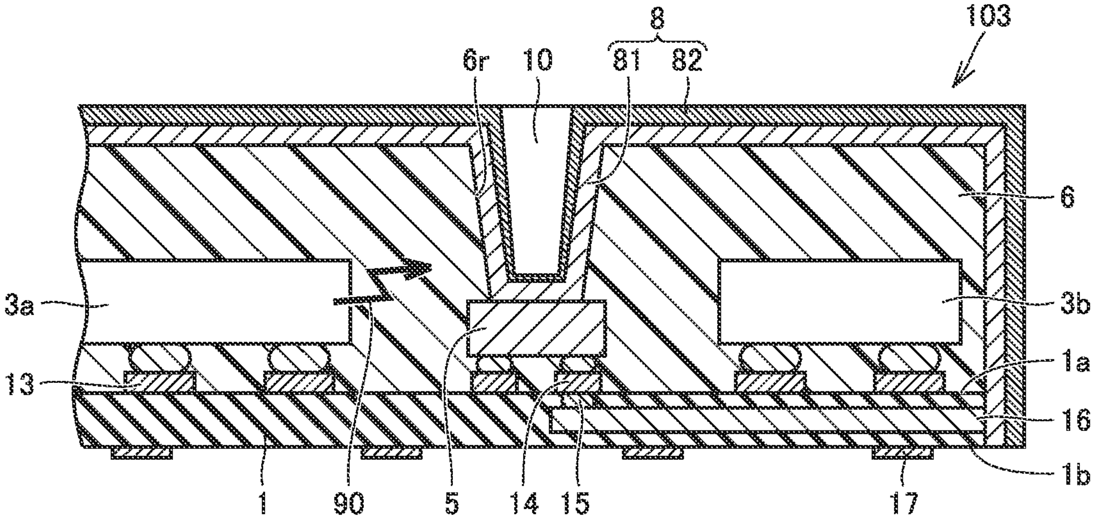
FIG. 15 is a partial cross section of a module according to a third embodiment of the present disclosure.

A module according to a third embodiment of the present disclosure will now be described with reference to FIG. 15. FIG. 15 is a partial cross section of a module 103 according to the present embodiment.

Module 103 has a basic configuration similar to that of module 102 described in the second embodiment except for a configuration of a film covering a side surface of resin seal 6. In module 103, first shield film 81 extends to and on the side surface of resin seal 6. In other words, in the present embodiment, first shield film 81 covers the side surface of resin seal 6. On the side surface of resin seal 6, shield film 8 has a dual structure of first shield film 81 and second shield film 82. Further, first shield film 81 extends to a lower end of the side surface of substrate 1. Substrate 1 also has a side surface covered with the dual structure of first shield film 81 and second shield film 82. Ground conductor pattern 16 is exposed at the side surface of substrate 1. Ground conductor pattern 16 is electrically connected to first shield film 81 at the side surface of substrate 1.

In the present embodiment, shield film 8 has a dual structure not only on the upper surface of resin seal 6 but also on the side surface thereof, which allows enhanced shielding performance not only in the direction perpendicular to first surface 1*a* of substrate 1 but also laterally thereof.

As indicated in the present embodiment, preferably, first shield film 81 covers a side surface of substrate 1 and ground conductor pattern 16 as a ground conductor is disposed inside substrate 1 such that ground conductor pattern 16 is exposed at the side surface of substrate 1, and first shield film 81 is connected to the ground conductor at the side surface of substrate 1. First shield film 81 electrically connected to ground conductor pattern 16 at the side surface of substrate 1 allows shield film 8 to be sufficiently grounded.

Fourth Embodiment

Figure 16:
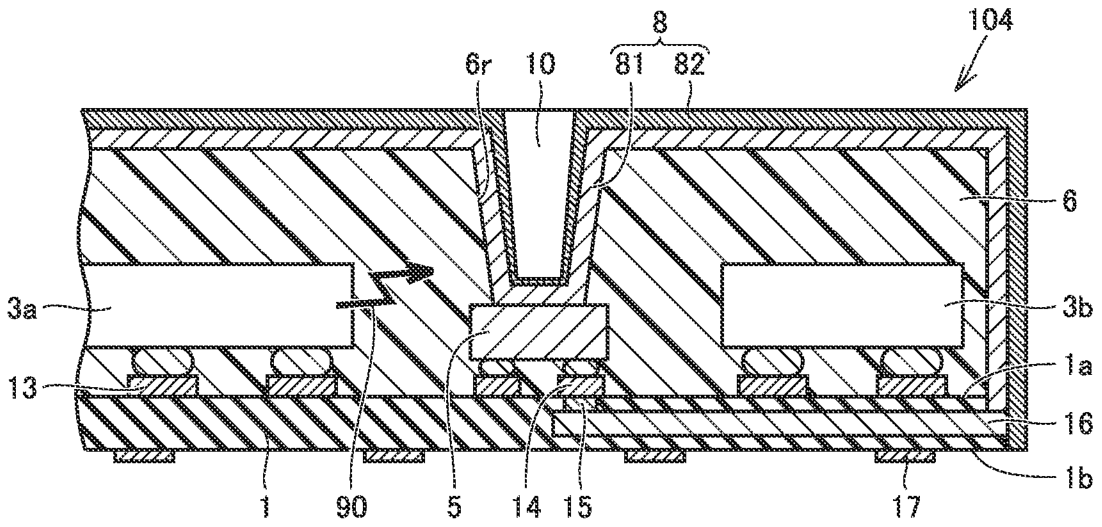
FIG. 16 is a partial cross section of a module according to a fourth embodiment of the present disclosure.

A module according to a fourth embodiment of the present disclosure will now be described with reference to FIG. 16. FIG. 16 is a partial cross section of a module 104 according to the present embodiment.

Module 104 has a basic configuration similar to that of module 103 described in the third embodiment except for a configuration of shield film 8 on a side surface of substrate 1.

In module 104, in a vicinity of an end of substrate 1, first shield film 81 is electrically connected to an upper surface of ground conductor pattern 16. Second shield film 82 is electrically connected to a side surface of ground conductor pattern 16.

The present embodiment can also be as effective as the third embodiment. In the present embodiment, first shield film 81 and second shield film 82 included in shield film 8 are both directly connected to ground conductor pattern 16, and shield film 8 can be more sufficiently grounded.

Figure 17:
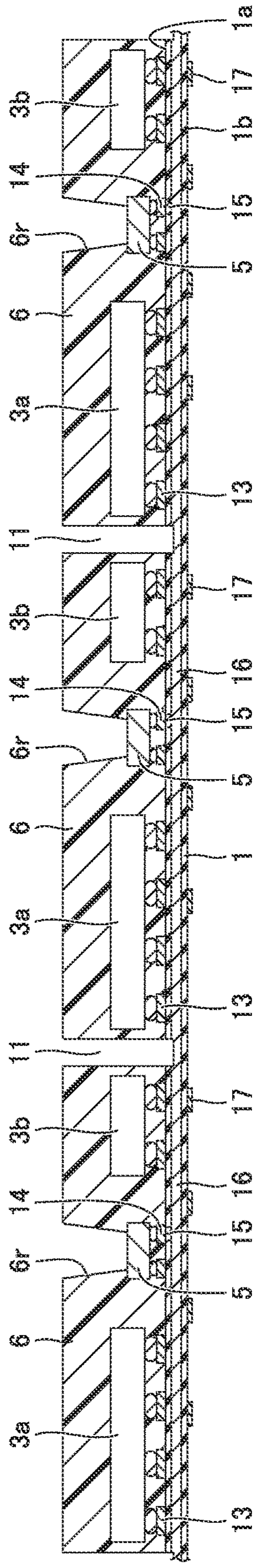
FIG. 17 is a diagram for illustrating a first step of a method for manufacturing the module according to the fourth embodiment of the present disclosure.
Figure 18:
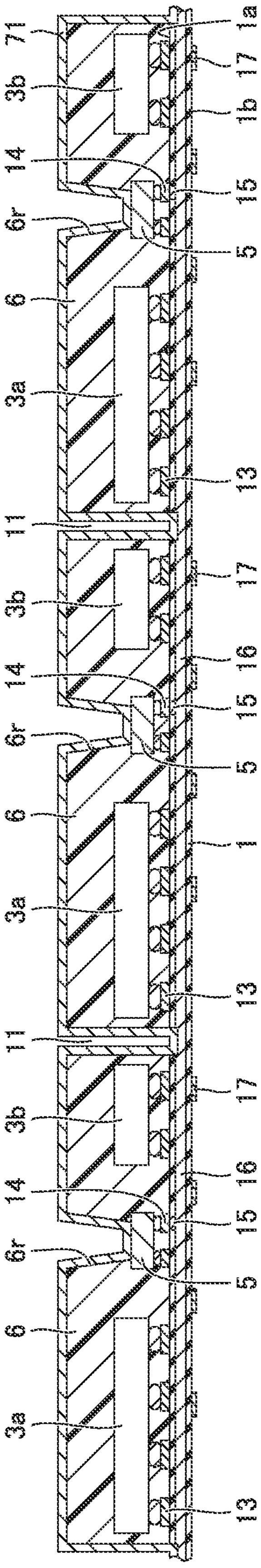
FIG. 18 is a diagram for illustrating a second step of the method for manufacturing the module according to the fourth embodiment of the present disclosure.

Module 104 indicated in the present embodiment can be manufactured as follows. After resin seal 6 is formed, recess 6*r* is formed, and furthermore, as shown in FIG. 17, a trench 11 is formed at a position corresponding to a boundary between individual products. At a bottom of trench 11, an upper surface of ground conductor pattern 16 incorporated in substrate 1 is exposed. After film 70 shown in FIG. 8 is placed on resin seal 6 and heated and compressed, release film 72 is peeled off. A structure is obtained as shown in FIG. 18. Further, each individual product is separated and sputtering or a like method is employed to form second shield film 82. Thus, module 104 can be obtained.

Herein, a method for manufacturing a module can be represented as follows. The method for manufacturing the module comprises: preparing substrate 1 having first surface 1*a*, having first component 3*a* and second component 3*b* mounted on first surface 1*a*, and having conductive member 5 mounted between first component 3*a* and second component 3*b*; disposing resin seal 6 so as to cover first surface 1*a*, first component 3*a*, second component 3*b*, and conductive member 5; forming recess 6*r* in resin seal 6 so as to expose at least a portion of conductive member 5; placing film 70 as a composite sheet including a structure of at least two layers of a metal grain film and a resin film deposited one on the other on an upper side of resin seal 6 such that the metal grain film underlies the resin film, and heating and compressing film 70 to form first shield film 81 of the metal grain film so as to cover a side surface of resin seal 6 and a surface of conductive member 5 inside recess 6*r*; and after forming first shield film 81, removing the resin film, and after removing the resin film, forming second shield film 82 by sputtering so as to cover an inner surface of recess 6*r*. Module 104 can thus be obtained.

Fifth Embodiment

Figure 19:
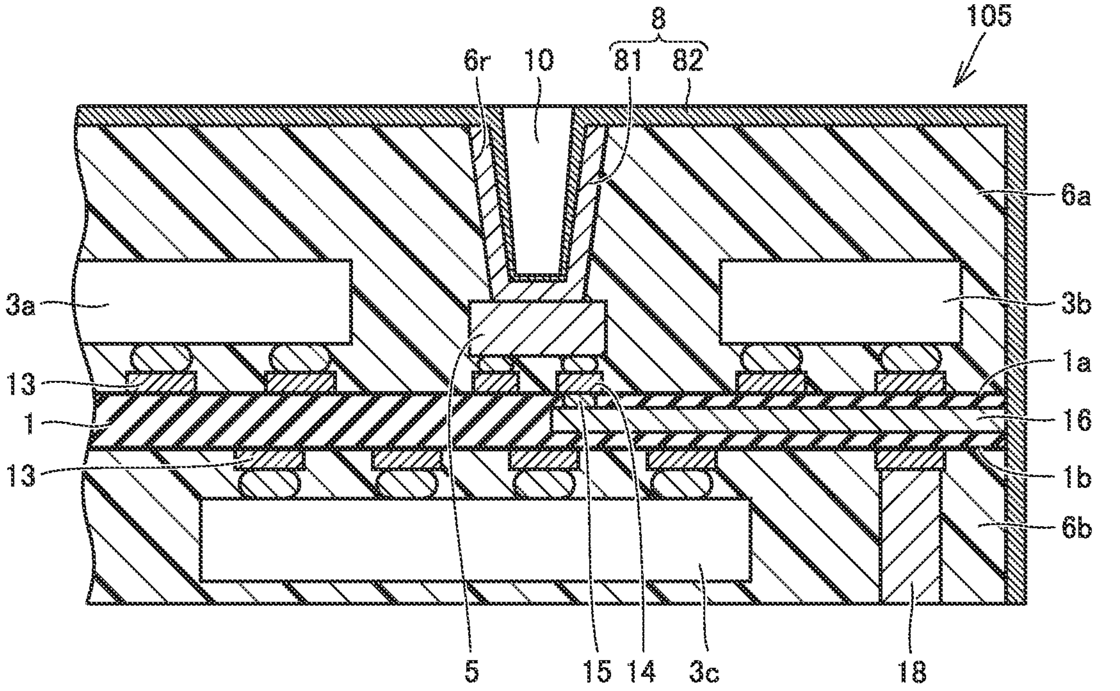
FIG. 19 is a partial cross section of a module according to a fifth embodiment of the present disclosure.

A module according to a fifth embodiment of the present disclosure will now be described with reference to FIG. 19. FIG. 19 is a partial cross section of a module 105 according to the present embodiment.

Module 105 according to the present embodiment has a so-called double-sided mounting structure. In module 105, substrate 1 has second surface 1*b* as a surface opposite to first surface 1*a*. Module 105 comprises a third component 3*c* mounted on second surface 1*b*. In module 105, a resin seal 6*a* is disposed so as to cover first surface 1*a* and first and second components 3*a* and 3*b*. A resin seal 6*b* is disposed so as to cover second surface 1*b* and third component 3*c*. Second shield film 82 also covers a side surface of resin seal 6*b*. A connection terminal 18, which is a columnar conductor, is mounted on second surface 1*b*. Connection terminal 18 penetrates resin seal 6*b* and is exposed at a lower surface of module 105. Connection terminal 18 may be covered with some conductor film. Alternatively, connection terminal 18 may be a solder bump.

Herein, while third component 3*c* is shown as an example to indicate that at least one component is mounted on second surface 1*b*, a component other than third component 3*c* may be mounted on second surface 1*b*. A plurality of components may be mounted on second surface 1*b*. Some of the plurality of components mounted on second surface 1*b* may have a lower surface exposed from resin seal 6*b*. While the example shown in FIG. 19 shows third component 3*c* having a lower surface covered with resin seal 6*b*, third component 3*c* may have the lower surface exposed from resin seal 6*b*.

In the present embodiment, module 105 has a double-sided mounting structure and third component 3*c* is also mounted on substrate 1 at second surface 1*b*, and more components can thus be mounted on substrate 1 having a limited area and it is thus easy to efficiently implement a highly functional module.

Note that a plurality of the above embodiments may be combined as appropriate and employed. It should be understood that the embodiments disclosed herein are illustrative and non-restrictive in any respect. The scope of the present disclosure is defined by the terms of the claims, and is intended to include any modifications within the meaning and scope equivalent to the terms of the claims.

1 substrate, 1*a* first surface, 1*b* second surface, 3*a* first component, 3*b* second component, 5 conductive member 6, 6*a*, 6*b* resin seal, 6*r* recess, 8 shield film, 10 recess, 11 trench, 13 pad electrode, 14 ground electrode, 15 conductor via, 16 ground conductor pattern, 17, 18 connection terminal, 70 film, 71 conductive film, 72 release film, 81 first shield film, 82 second shield film, 90 electromagnetic wave, 91 arrow, 101, 102, 103, 104, 105 module.

The invention claimed is:

1. A module comprising:

a substrate having a first surface;

a first component and a second component mounted on the first surface;

a conductive member mounted on the first surface between the first component and the second component; and a resin seal disposed to cover the first surface and the first and second components and also seal a portion of the conductive member;

the resin seal having a recess, the recess exposing at least a portion of the conductive member, inside the recess, the resin seal and the conductive member having a side surface and a surface, respectively, covered with a first shield film, the first shield film in the recess being covered with a second shield film less in thickness than the first shield film, a surface of the resin seal facing away from the first surface being covered with the second shield film, the surface of the resin seal facing away from the first surface except the recess is not covered with the first shield film.

2. The module according to claim 1, wherein the first shield film covers a side surface of the resin seal.

3. The module according to claim 2, wherein the first shield film covers a side surface of the substrate, a ground conductor is disposed inside the substrate such that the ground conductor is exposed at the side surface of the substrate, and the first shield film is connected to the ground conductor at the side surface of the substrate.

4. The module according to claim 3, wherein the first shield film is a metal grain film.

5. The module according to claim 3, wherein the first shield film contains silver as an ingredient.

6. The module according to claim 3, wherein the conductive member is a Cu block.

7. The module according to claim 2, wherein the first shield film is a metal grain film.

8. The module according to claim 2, wherein the first shield film contains silver as an ingredient.

9. The module according to claim 2, wherein the conductive member is a Cu block.

10. The module according to claim 1, wherein the first shield film is a metal grain film.

11. The module according to claim 10, wherein the first shield film contains silver as an ingredient.

12. The module according to claim 1, wherein the first shield film contains silver as an ingredient.

13. The module according to claim 1, wherein the conductive member is a Cu block.

14. The module according to claim 1, wherein the substrate has a second surface as a surface opposite to the first surface, and the module comprises a third component mounted on the second surface.

15. The module according to claim 1, wherein the first shield film is a metal grain film.

16. The module according to claim 1, wherein the first shield film contains silver as an ingredient.

17. The module according to claim 1, wherein the conductive member is a Cu block.

* * * * *